United States Patent
Lee

[19]

[11] Patent Number: 5,875,965
[45] Date of Patent: Mar. 2, 1999

[54] AIR CIRCULATION SYSTEM FOR REDUNDANT ARRAYS OF INEXPENSIVE DISKS AND METHOD OF CONTROLLING AIR CIRCULATION

[75] Inventor: Hae-Seung Lee, Ahnyang-city, Rep. of Korea

[73] Assignee: SamSung Electronic Co., Ltd., Paldal-ku, Rep. of Korea

[21] Appl. No.: 933,756

[22] Filed: Sep. 23, 1997

[30] Foreign Application Priority Data

Sep. 23, 1996 [KR] Rep. of Korea ................. 41713/1996

[51] Int. Cl.$^6$ ........................................ F24F 7/00
[52] U.S. Cl. ................... 236/446; 236/49.3; 454/239; 361/195
[58] Field of Search ................ 236/49.3, 44 R, 236/44 A, 44 C, 44 E, 49.1; 454/184, 239, 229; 361/694, 695, 696, 697

[56] References Cited

U.S. PATENT DOCUMENTS

| | | | |
|---|---|---|---|
| 3,585,811 | 6/1971 | Friedel | 62/173 |
| 3,599,063 | 8/1971 | Nanai | 318/327 |
| 3,682,381 | 8/1972 | Eckman et al. | 236/38 |
| 3,765,244 | 10/1973 | Brzezinski | 73/362 AR |
| 3,976,925 | 8/1976 | Rudich, Jr. | 318/257 |
| 3,991,624 | 11/1976 | Davies | 73/189 |
| 4,500,944 | 2/1985 | Roberts et al. | 361/384 |
| 4,512,161 | 4/1985 | Logan et al. | 62/176.6 |
| 4,685,303 | 8/1987 | Branc et al. | 62/3 |
| 4,733,541 | 3/1988 | Ismail et al. | 361/695 X |
| 4,774,631 | 9/1988 | Okuyama et al. | 361/384 |
| 4,818,924 | 4/1989 | Burney | 318/561 |
| 4,848,444 | 7/1989 | Heinle et al. | 165/21 |
| 4,910,445 | 3/1990 | Borfmann | 318/468 |
| 5,021,726 | 6/1991 | Reinhaudt et al. | 318/811 |
| 5,102,040 | 4/1992 | Harvey | 236/49.3 |
| 5,253,804 | 10/1993 | Sarazen, Jr. et al. | 236/44 C |
| 5,438,226 | 8/1995 | Kuchta | 307/125 |
| 5,471,099 | 11/1995 | Larabell et al. | 307/53 |
| 5,570,838 | 11/1996 | Davis, Jr. et al. | 236/49.3 |
| 5,572,403 | 11/1996 | Mills | 361/695 |
| 5,586,250 | 12/1996 | Carbonneau et al. | 395/183.2 |
| 5,655,375 | 8/1997 | Ju | 62/3.6 |

*Primary Examiner*—Harry B. Tanner
*Attorney, Agent, or Firm*—Robert E. Bushnell, Esq.

[57] ABSTRACT

An air circulation system for an RAID system, having fan motors driving fans for circulating air inside the RAID and a power supply for the fan motors, includes: a sensing circuit for producing electrical signals proportional to the environmental conditions of the RAID's interior; a controller for producing control signals for controlling the direction of rotation of the fan motors when the signal exceeds a preset reference value; and a switching circuit for changing the polarity of the power supply, and thus the direction of rotation of the fan motors, in response to control signals from the controller.

21 Claims, 8 Drawing Sheets

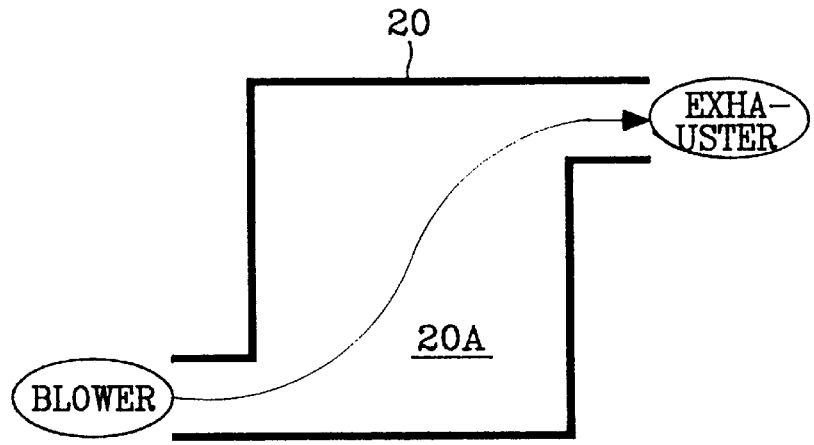
Fig. 2A *(Prior Art)*
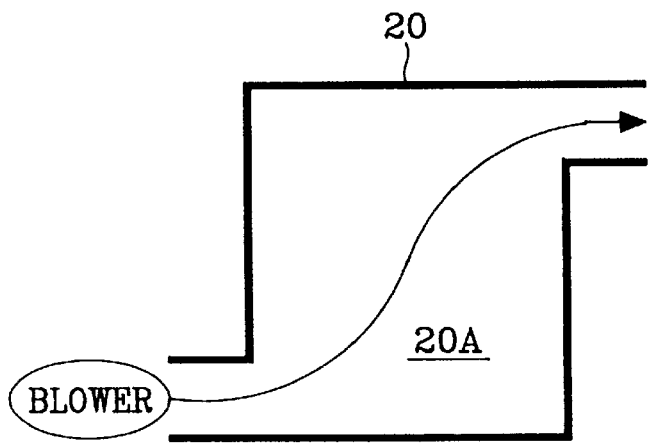
Fig. 2C *(Prior Art)*
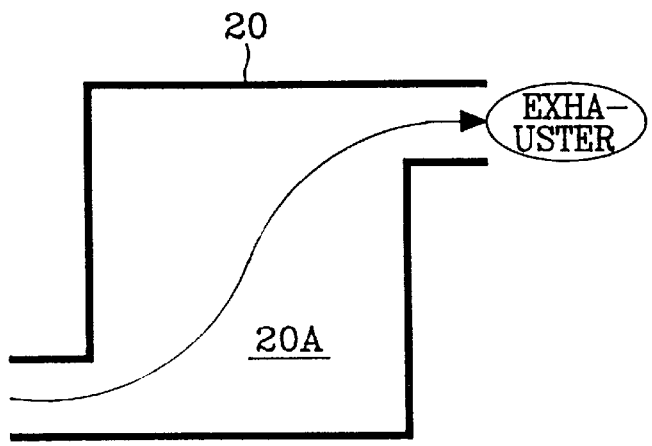
Fig. 2B *(Prior Art)*

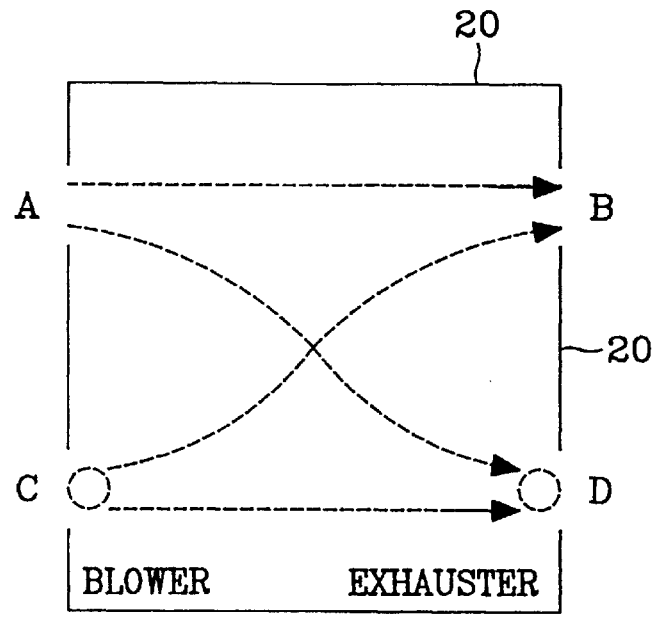
Fig. 3 *(Prior Art)*
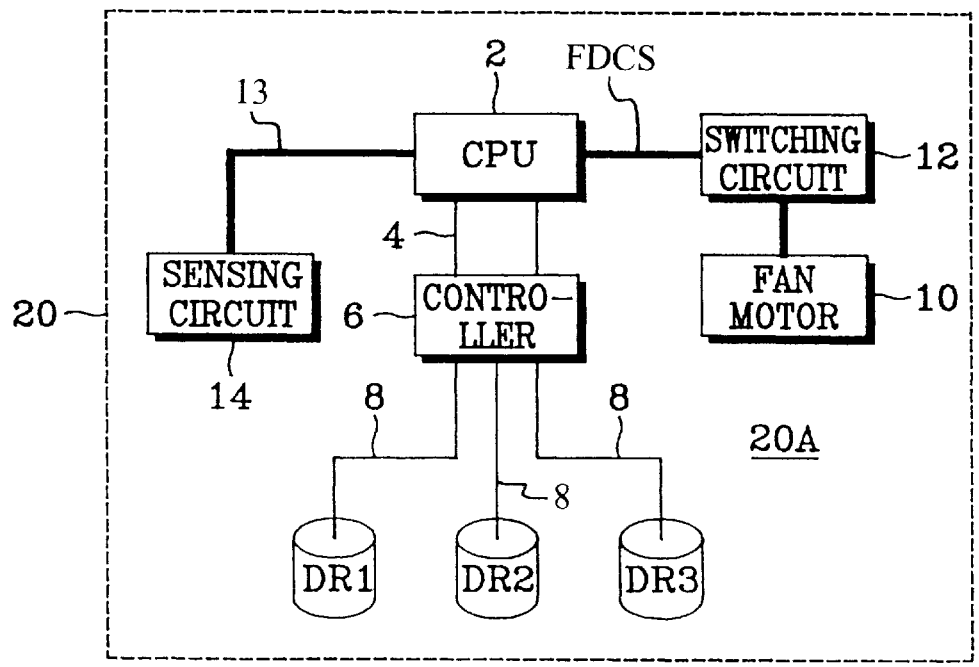
Fig. 4

AIR CIRCULATION SYSTEM FOR REDUNDANT ARRAYS OF INEXPENSIVE DISKS AND METHOD OF CONTROLLING AIR CIRCULATION

CLAIM OF PRIORITY

This application makes reference to, incorporates the same herein, and claims all benefits accruing under 35 U.S.C. §119 from an application for AIR CIRCULATION SYSTEM FOR REDUNDANT ARRAYS OF INEXPENSIVE DISK AND METHOD OF CONTROLLING earlier filed in the Korean Industrial Property Office on the 23$^{rd}$ of Sep. 1996 and there duly assigned Ser. No. 41713/1996.

BACKGROUND OF THE INVENTION

1. Technical Field

The present invention generally relates to redundant arrays of inexpensive disks (RAID). More particularly, it relates to an air circulation system that operates according to the environmental conditions of the RAID's interior, and it further relates to a method of controlling the air circulation cycle within the RAID.

2. Related Art

The efficiency of computer systems is dependent on the performance of a central processing unit (CPU) and its input/output (I/O) subsystem. With the development of VLSI technology, the data processing time of the CPU has been significantly reduced, while operating speeds of the I/O subsystem have improved relatively less. Thus, the proportion of data I/O time to the overall system operating time is increasing. Also, when a malfunction occurs in the I/O subsystem, the costs of recovering data stored in the failed system has increased. In recent years, the demand for high performance high-reliability I/O subsystems has increased and, to meet this demand, some remarkable research and development have been devoted to RAID systems. RAID related techniques have become common.

Academic institutions are conducting research on RAID algorithms, and enterprises are striving for RAID systems with higher capacities and improved reliability through various performance tests. Disk arrays have been used for super computers, such as those built by the Cray Computer Company, to improve I/O throughput from hard disks. Computer scientists at Berkeley University, USA created the first RAID theory in 1988. Although RAID theory can be applied to sequential access devices, such as cartridge tapes, most attention is being focused on hard disk devices.

Traditional disk devices are typically single large expensive disks (SLED) having form factors of 12 or 14 inches. The wide use of personal computers has created a market for inexpensive small form factor drives. Consequently, a disk storage device having a redundant array of inexpensive disks has become a practical alternative for storing large amounts of data. The primary objective of RAID systems is to create higher storage capacities and faster I/O throughput using stripping. Stripping involves the concurrent transfer of data to an array of disk drives in "stripes". RAID architectures are divided into the following six levels by application environments and the characteristics of computer systems to which RAID is applied:

RAID level 0:

RAID level 0 distributes the data over all of the drives in the array. It focuses on the disk performance rather than on the disk reliability.

RAID level 1:

Mirroring is one of the traditional techniques used with RAID systems to improve disk performance. With this technique, all data on the disks should be and are simultaneously stored on copy disks, which is not cost-effective. RAID level 1 is limited since the actually usable disk capacity is 50%, and is not advantageous to a system needing large-capacity disks, such as a database system. However, since the same data are stored on the copy disks, RAID level 1 is the best way to keep the data secure.

RAID level 2:

RAID level 2 was developed in order to reduce the costs of keeping data secure, and distributes data over all of the drives in the array by bytes. RAID level 2 has several test disks for error detection and error correction in addition to the data storage disks.

RAID level 3:

RAID level 3 reads and writes data from and into N data plus P parity direct access storage devices synchronously. Parity data are stored in extra parity drives, and disk spindles are synchronized so that data are input to and output from all of the drives in an array simultaneously, which increases the data rate even if data input and output do not occur synchronously. If a drive in the array fails, it is possible to reconstitute the data from the failed drive using the remaining drives and parity drives, although the overall data rate is decreased. RAID level 3 is used in application systems, super computers, image manipulation processors, etc.

RAID level 3 is the most efficient in the transmission of large blocks of data, but is disadvantageous in the transmission of small blocks of data and responding to rapid I/O requests. Additionally, with RAID level 3, a single large expensive drive is required for redundancy along with data storage drives. While RAID level 3 has fewer drives than RAID level 1 does, it needs a complicated, and thus expensive, controller.

RAID level 4:

RAID level 4 stores parity data on the same drive with data stripped across an array of disks, where one block of a stripe is reserved for parity data. It is possible for RAID level 4 to restore data stored on a failed drive. The data-read performance is similar to that of RAID level 1, but the data-write performance is inferior because RAID level 4 stores parity data on the same drive. To alleviate the drawbacks of RAID level 4, RAID level 5 has been developed.

RAID level 5:

In RAID level 5, data are stripped across an array of drives. RAID level 5 distributes the parity blocks over all of the drives in the array for the purpose of precluding a bottleneck during write operations. It is required to read the data written into all the drives in the array so as to recalculate parity during data write operations, which increases its data processing time. In RAID level 5, data input/output processing is possible, and missing data from a failed drive can be recreated. Accordingly, RAID level 5 is suitable for large blocks of data and, if an application program for RAID level 5 focuses on data reading, or if writing performance can be improved, RAID level 5 also may have advantages with small blocks of data.

With the decreased size of data blocks, RAID level 5 may assure a degree of efficiency and data availability. RAID level 5 offers a cost-effective solution, compared to a non-array device.

The above-described disk arrays are equipped with cooling systems, but their hard disk drives are particularly sensitive to ambient temperature and humidity, and may encounter off-tracking of their servo-systems due to disk deformation resulting in read/write errors. In addition, the disk surface may be stained with dirt and dust or corroded by gas, thereby causing fatal disk failures. Each of the RAID systems uses a cooling system, whereby fresh air continuously enters and is circulated inside the RAID system, thus driving out bad air. This cooling system may prevent the RAID systems' interior from being contaminated or overheating. As described above, the cooling system for a RAID system is used to prevent the system from failing due to environmental factors, (ambient temperature, humidity, etc.), such as heat emitted from its hard disk drive and power supply, surface temperatures of the system body, polluted interior air of the system, etc.

The following patents are considered to be representative of the art relative to the invention disclosed and claimed herein: U.S. Pat. No. 5,438,226 to Kuchta, entitled Apparatus For Redundant Cooling Of Electronic Devices, U.S. Pat. No. 5,471,099 to Larebell et al., entitled Modular Enclosure Apparatus, U.S. Pat. No. 5,586,250 to Carbonneau et al., entitled SCSI-Coupled Coupled Module For Monitoring And Controlling SCSI Coupled RAID Bank And Bank Environment, U.S. Pat. No. 4,500,944 to Roberts et al., entitled Enclosure For Electronic Components, U.S. Pat. No. 4,512,161 to Logan et al., entitled Dew Point Sensitive Computer Cooling System, U.S. Pat. No. 4,685,303 to Branc et al., entitled Disc Drive Isolation System, U.S. Pat. No. 4,774,631 to Okuyama et al., entitled Cooling Structure Of Electronic Equipment Rack, U.S. Pat. No. 5,102,040 to Harvey, entitled Method And Apparatus For Fan Control To Achieve Enhanced Cooling, U.S. Pat. No. 5,570,838 to Davis Jr. et al., entitled Method And Control System For Controlling An Automotive HVAC System For Increased Occupant Comfort, U.S. Pat. No. 5,572,403 to Mills, entitled Plenum Bypass Serial Fan Cooling Subsystem For Computer Systems, U.S. Pat. No. 5,655,375 to Ju, entitled Antenna Mast-Top Mountable Thermo-Electrically Cooled Amplifier Enclosure System, U.S. Pat. No. 3,682,381 to Eckman et al., entitled Air Conditioning Apparatus, U.S. Pat. No. 3,599,063 to Nanai, entitled Speed Control System For D.C. Motor, U.S. Pat. No. 3,585,811 to Friedel, entitled Air Conditioned Storage System, U.S. Pat. No. 3,976,925 to Rudich Jr., entitled Integral Motor Controller, U.S. Pat. No. 3,991,624 to Davies, entitled Wind Velocity Servo System, U.S. Pat. No. 4,818,924 to Burney, entitled Electric Actuator For Automotive Air Conditioning Systems, U.S. Pat. No. 4,848,444 to Heinle et al, entitled Process And Processor For The Control Of Parameters Of The Interior Air In A Motor Vehicle Having An Air Conditioning System, U.S. Pat. No. 4,910,445 to Borrmann, entitled Actuating Device For Movable Parts For Closing Of Apertures In Vehicles And Vehicle Roof Utilizing Same, U.S. Pat. No. 5,021,726 to Reinhardt et al., entitled Process For Driving An Alternating-Current Motor And An Alternating Current Motor Which Can Be Driven In Accordance With This Process, and U.S. Pat. No. 3,765,244 to Brzezinski, entitled Digital Readout Instrument Employing Transducer And Double D.C. Power Supply.

Of the patent listed above, only the following relate to RAID systems: Kuchta '226; Larabell et al. '099; Carbonneau et al. '250. Each of these patents relates, at least generally, to the control of the environment in the RAID system (for example, control of temperature). However, none of the patents discloses an arrangement or method for controlling both temperature and humidity in the RAID system, and none of the patents discloses an arrangement or method which controls temperature and humidity conditions with the precision necessary in order to ensure proper and sustained operation of the RAID system.

The following patents disclose arrangements or methods for controlling the environment surrounding electronic components in general: Roberts et al. '944; Logan et al. '161; Branc et al. '303; Okuyama et al. '631; Harvey '040; Davis Jr. et al. '838; Mills '403; and Ju et al. '375. However, none of these patents relates to the control of an environment surrounding an RAID system, with its unique requirements for precision-controlled environmental conditions, and none of the latter patents discloses or suggests the method and arrangement disclosed and claimed herein.

Finally, the remaining patents listed above do not relate to the control of environmental conditions within an enclosure housing electronic components, and do not disclose or suggest the method and arrangement disclosed and claimed herein.

SUMMARY OF THE INVENTION

It is an objective of the present invention to provide an air circulation system for an RAID which is capable of controlling air circulation inside the RAID according to the environmental condition of the RAID's interior, coping with unexpected variations in ambient temperature or humidity.

In order to realize the above objectives, the present invention provides an air circulation system for a RAID system having fan motors driving fans for circulating air inside the RAID, and a power supply for the fan motors, including a sensing circuit to produce electrical signals proportional to the environmental conditions of the RAID's interior; a controller producing control signals for controlling the direction of the fan motors when the signal exceeds a preset reference value; and a switching circuit to change the polarity of the power supply in response to control signals from the controller.

BRIEF DESCRIPTION OF THE DRAWINGS

A more complete appreciation of the invention, and many of the attendant advantages thereof, will be readily apparent as the same becomes better understood by reference to the following detailed description when considered in conjunction with the accompanying drawings in which like reference symbols indicate the same or similar components, wherein:

FIGS. 2A, 2B and 2C show three types of an air circulation system for a RAID level 5;

FIG. 3 is a sectional view of a traditional RAID body for describing a conventional one-way air circulation system;

FIG. 4 is a block diagram of an RAID with an air circulation system in accordance with a preferred embodiment of the present invention;

DETAILED DESCRIPTION OF THE PREFERRED EMBODIMENT

Figure 1:
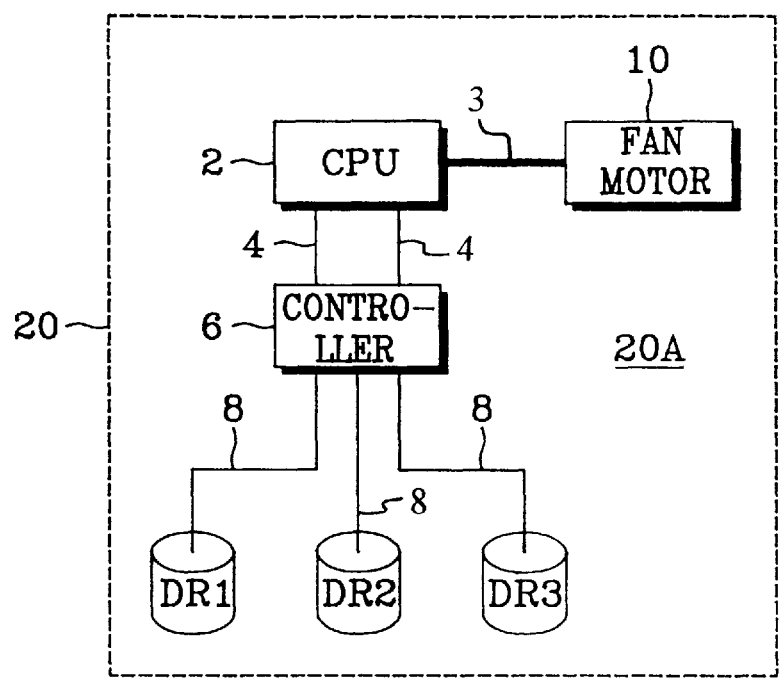
FIG. 1 is a block diagram of an RAID level 5 with an air circulation system.

Referring to FIGS. 1 to 3, the air circulation system for a conventional RAID will be described.

FIG. 1 is a block diagram of an RAID level 5 with an air circulation system, and FIGS. 2A, 2B and 2C show three types of air circulation systems for the RAID level 5, which provide air circulation in various ways depending on the operation of a fan motor 10. FIG. 3 is a sectional view of RAID body 20 for describing a conventional one-way air circulation system.

As shown in FIG. 1, a central processing unit (CPU) 2 transmits data that are sent by a host computer (not shown) via an I/O bus 4 to a controller 6. Controller 6 is connected to I/O bus 4 and is supervised by CPU 2, which controls I/O data between drives DR1 to DR3, each connected to bus 8, and CPU 2. The data from the host computer are written onto or read from each drive DR1 to DR3, connected to bus 8, under the control of controller 6. Fan motor 10, connected to CPU 2, serves as a cooling device inside of the system. The fan rotates in direct response to a fan control signal 3 generated by CPU 2. Fan motor 10 serves as a blower or air exhauster depending on its position inside RAID body 20.

FIG. 2A illustrates the first type of an air circulation system, in which fans (fan motors 10) are positioned on the intakes and outlets of RAID body 20, functioning as blowers and air exhausters. FIG. 2B depicts a second type, where fan motor 10 is located on the intake of RAID system body 20 in order to serve as a blower. FIG. 2C depicts a third type, where fan driving motor 10 is located on the outlet of RAID system body 20, acting as an air exhauster.

The above are represented in Table I and in FIG. 3. Reference letters A and C of FIG. 3 each denote intakes, and B and D designate outlets.

TABLE 1

| CIRCULATION TYPE | INTAKE | OUTLET |
|---|---|---|
| FIRST TYPE | C | D |
| SECOND TYPE | C | B |
| THIRD TYPE | A | D |
| FOURTH TYPE | A | B |

With reference to Table 1, a conventional RAID system provides unidirectional ventilation (i.e. C→D,C→B,A→D, and A→B)just using fan motor 10, and cannot dynamically cope with unexpected environmental variation within the RAID's interior.

Reference is now made in detail to the preferred embodiment of the present invention, examples of which are illustrated in the accompanying drawings. For a better understanding of the present invention, the following is a description of: the operation of fan motor 10 according to its location, operating points (T1 and T2), and the control sequence of the present invention.

FIG. 4 is a block diagram of an RAID with an air circulation system in accordance with a first preferred embodiment of the present invention.

In the inventive RAID, sensing circuit 14 (temperature sensor and humidity sensor) is added to a conventional RAID. A switching circuit 12 is connected between CPU 2 and fan motor 10 to change the polarity of the electricity going to fan motor 10 from a power supply (not shown) in response to a fan driving control signal FDCS produced by CPU 2. Sensing circuit 14 consists of a temperature and a humidity sensor, and supplies CPU 2 with an electrical signal 13 corresponding to ambient temperature and humidity. CPU 2 has a control program in the first preferred embodiment. When the electrical signal 13 produced by sensing portion 14 exceeds a preset reference value (ambient temperature and humidity of the RAID system), CPU 2 generates fan driving control signal FDCS, to control the direction of fan motor 10.

Figure 5:
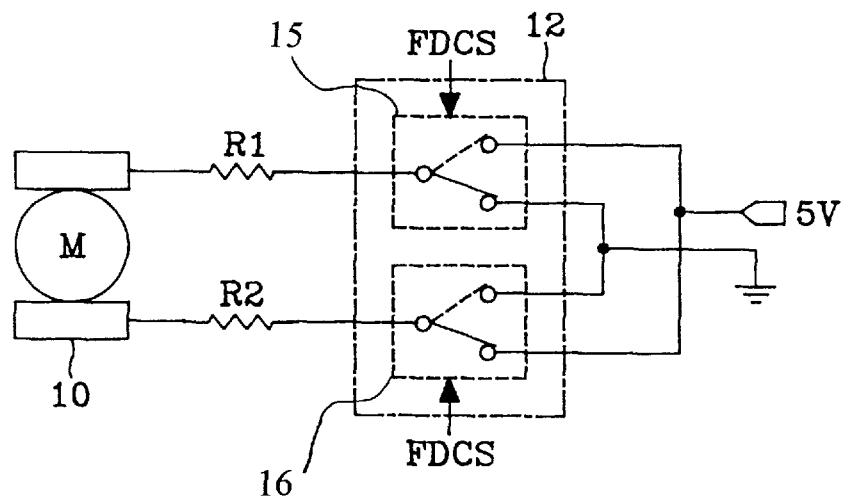
FIG. 5 is a detailed circuit diagram of the fan motor and switching circuit of FIG. 4.

A controller 6, connected with an I/O bus 4, is supervised by CPU 2, and controls I/O data between drives DR1 to DR3, connected to bus 8, and CPU 2. Data sent from a host computer are written onto or read from each drive DR1 to DR3 connected to bus 8 under the control of controller 6. FIG. 5 is a detailed circuit diagram of the fan motor 10 and switching circuit 12 of FIG. 4.

As shown in FIG. 5, the two leads of fan motor 10 are connected to one side of each of switches 15 and 16 via resistors R1 and R2, respectively, where the other sides of the switches 15 and 16 are connected to a 5V terminal and ground. The switches 15 and 16 change polarity according to fan driving control signal FDCS, produced by CPU 2, so that fan driving motor 10 operates in either direction in order to move air inside the RAID.

Figure 8:
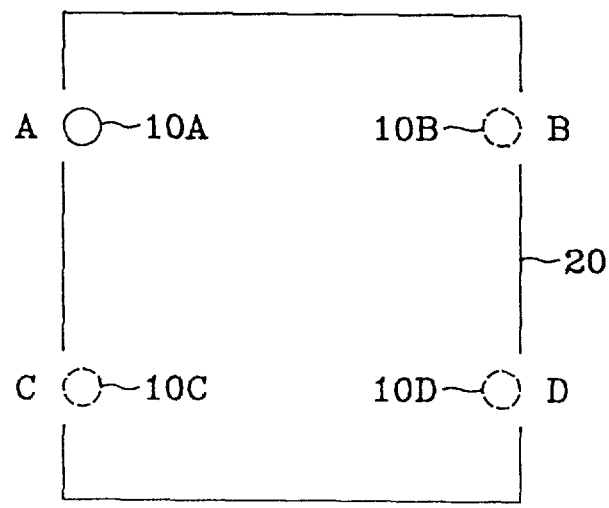
FIG. 8 is a sectional view of a RAID for describing its air circulation cycle in accordance with the first preferred embodiment of the present invention.
Figure 6:
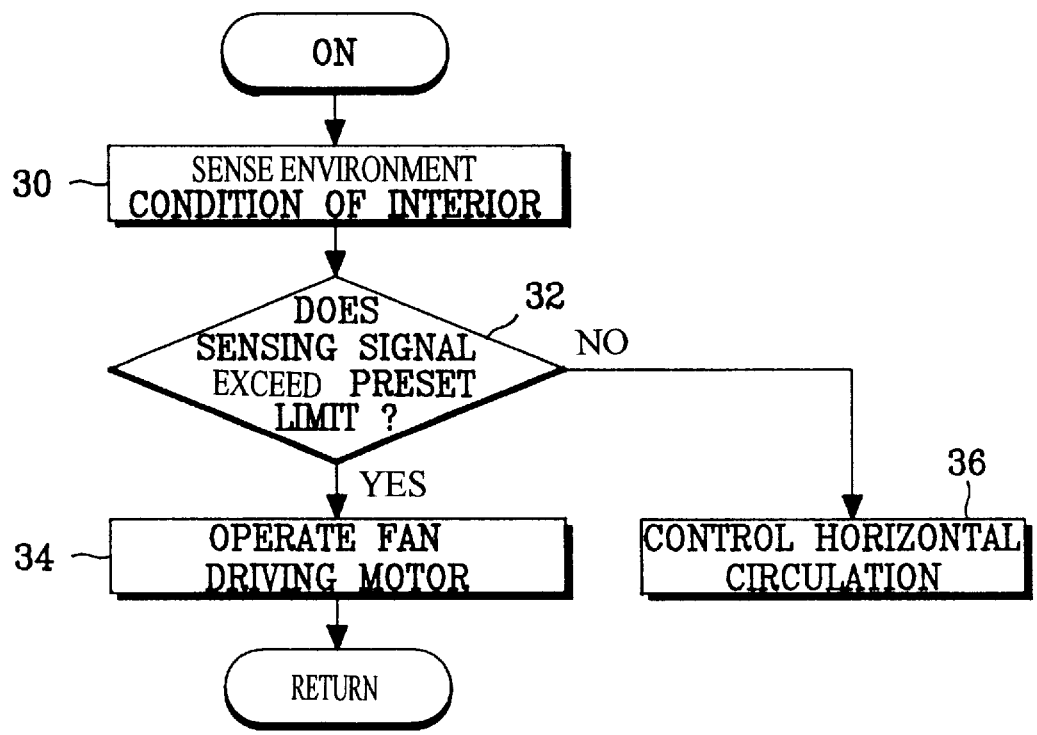
FIG. 6 is a flow chart of the control sequence for the fan motor in accordance with the first preferred embodiment of the present invention.
Figure 7A:
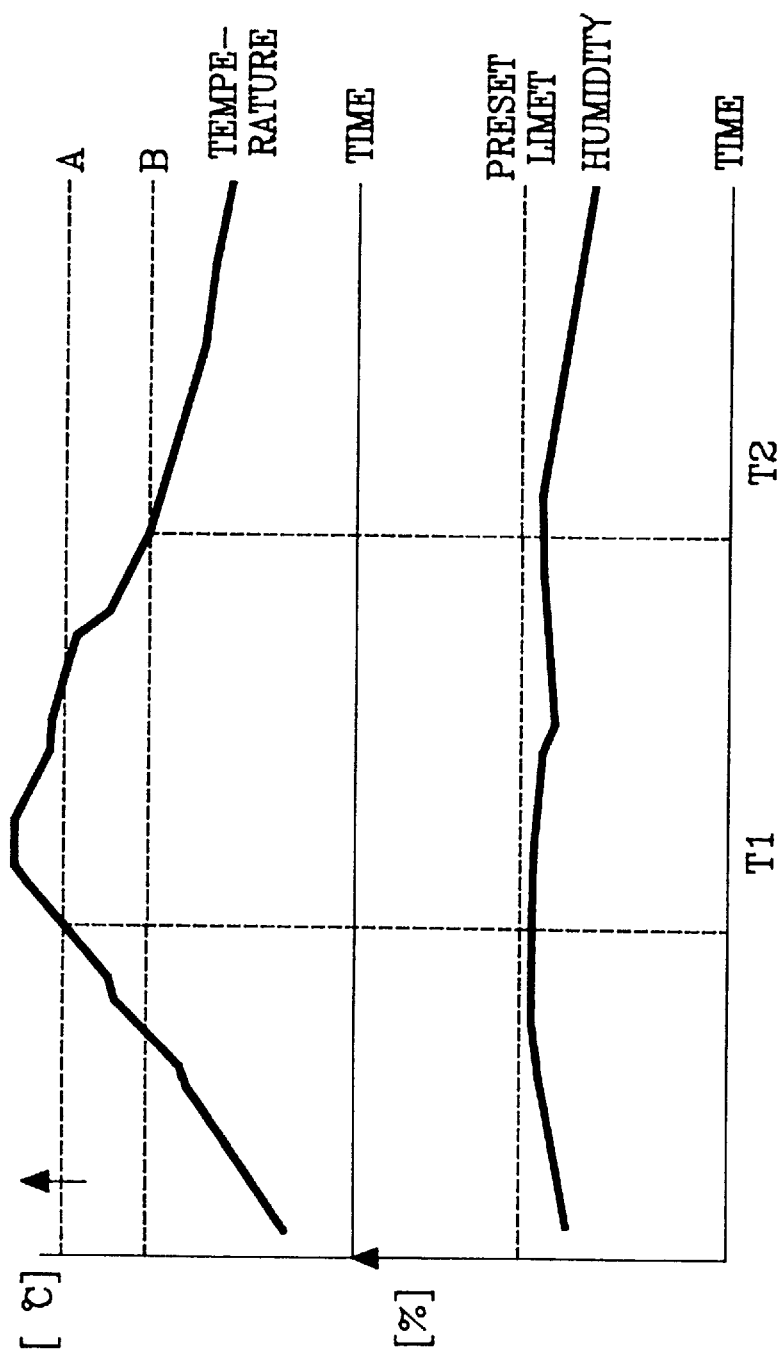
FIGS. 7A to 7C graphically show variations in ambient temperature and humidity within the RAID's interior to describe the control of the fan motors in response to the environmental condition of the RAID.
Figure 7B:
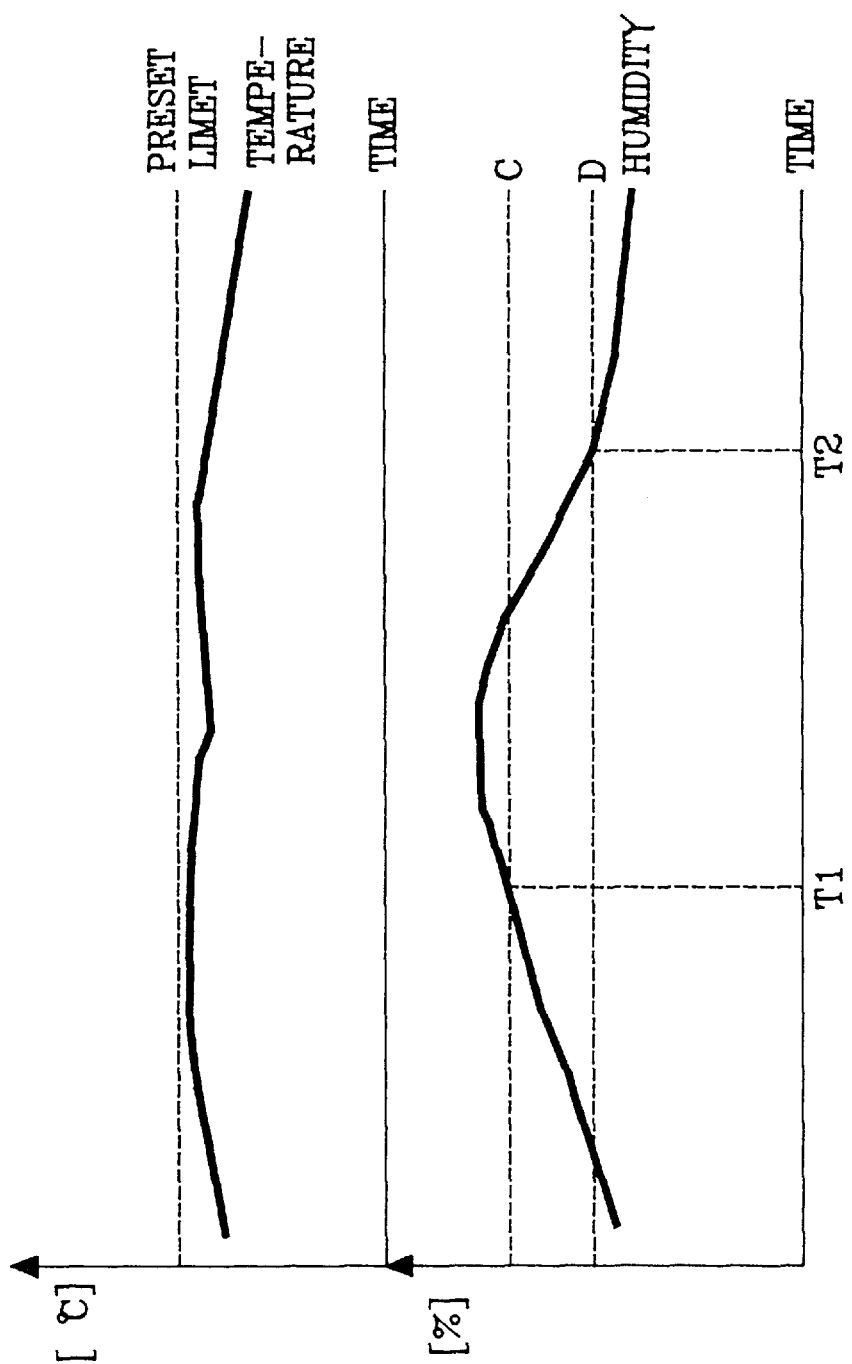
Figure 7C:
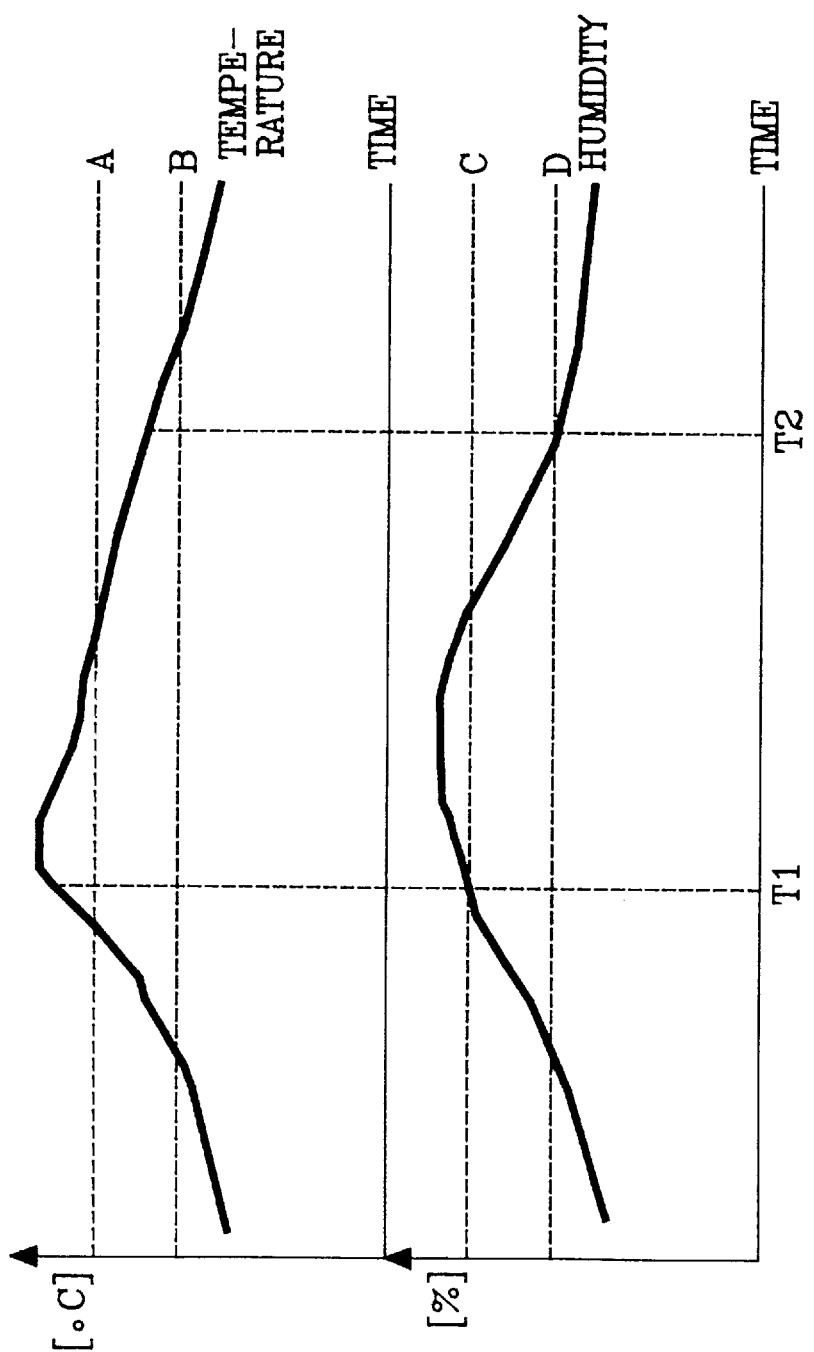

FIG. 6 is a flow chart of the control sequence of fan motor 10 in accordance with the first preferred embodiment of the present invention, and FIGS. 7A to 7C graphically show variations in ambient temperature and humidity in the RAID's interior, thus describing the control of fan driving motor 10 according to environmental conditions. FIG. 8 is a sectional view of the RAID for describing its air circulation cycle in accordance with the first preferred embodiment of the present invention, in which four fan driving motors 10A to 10D are positioned on intakes and discharges so as to function as blowers or air exhausters.

The inventive air circulation system will be now described with reference to FIGS. 6 to 8.

Referring first to FIGS. 4 and 6, CPU 2 monitors the environmental condition of the RAID's interior using sensing circuit 14, and determines (S32) if the signal from sensing portion 14 satisfies a preset limit. This reference value is set on the basis of the environmental specifications of the RAID as determined through various tests.

If the output signal of sensing circuit 14 exceeds the preset limit, CPU 2 produces (S34) a fan driving control signal FDCS for operating fan driving motor 10, and then returns to its initial state. When the output signal of sensing portion 14 does not exceed the preset limit, CPU 2 allows (S36) the air inside the RAID system to circulate in a horizontal direction, and then return to its initial state.

The following description concerns cases where the output signal of sensing circuit 14 exceeds the preset limit of the RAID, and also relates to the horizontal air circulation cycle.

Each horizontal axis of FIGS. 7A to 7C corresponds to time, and each vertical axis corresponds to temperature (C°) and humidity (%). If the ambient temperature and humidity inside to the RAID vary as shown in FIG. 7A (Case 1), CPU 2 detects the ambient temperature and humidity inside the RAID by using sensing circuit 14. When the ambient temperature exceeds A, CPU 2 generates fan driving control signal FDCS at T1, so as to manipulate fan motor 10. At this point, A is a maximum value of ambient temperature for energizing fan motor 10, and B is a minimum value of ambient temperature for deenergizing fan driving motor 10.

Switching circuit 12 is designed to allow the fan driving control signal FDCS produced at T1 to be applied to all four fan motors 10A to 10D shown in FIG. 8, and causes fan motors 10C, 10D and 10A, 10B to operate as blower and air exhauster, respectively. RAID's ambient temperature drops and, if it drops below the maximum value of ambient temperature B, CPU 2 stops the fan driving control signal FDCS at T2 to thereby deenergize fan driving motors 10.

In the meantime, if RAID's ambient humidity exceeds C (Case 2), CPU 2 generates the fan driving control signal FDCS at T1. At this point, C is the maximum value of ambient humidity set for actuating fan motor 10, and D is a minimum value of ambient humidity for deenergizing fan driving motor 10.

Switching circuit 12 is designed to allow the fan driving control signal FDCS produced at T1 to be applied to all of four fan driving motors 10A to 10D, shown in FIG. 8, and causes fan motors 10A, 10B and 10C, 10D to function as blowers and air exhausters, respectively. When the RAID's ambient humidity is lower than the minimum value of ambient humidity D as fan driving motor 10 rotates, CPU 2 stops the fan driving control signal FDCS at T2, thereby deenergizing fan driving motor 10.

When the ambient temperature and humidity inside the RAID exceed A and C, respectively (Case 3), as shown in FIG. 7C, CPU 2 produces the fan driving control signal FDCS at T1 to energize fan driving motors 10. Reference letters A, B, C and D denote the same reference values.

Fan driving control signal FDCS produced at T1 is applied to all four fan motors 10A to 10D. Fan motors 10A and 10B are designed to function as blowers in response to the generation of the fan driving control signal FDCS, and motors 10C and 10D are then allowed to serve as air exhausters. If the ambient temperature and humidity inside the RAID exceed the preset reference values, the moisture inside the RAID is maintained in a vaporous state by the heat. If the moisture contacts the inner surfaces of the RAID body 20 or the RAID internal parts whose temperatures are under the dew point, it may damage the RAID components. Accordingly, fan motors 10A and 10B are operated as blowers to move hot air downward so that any moisture vaporizes. When the air containing vapor is driven out, fan driving motors 10A and 10B are operated as air exhausters to circulate ambient air down and up, thereby providing ventilation within the interior of the RAID.

When the ambient temperature and humidity inside the RAID are normal (Case 4), the fans create a horizontal air circulation system, which reduces the difference between the RAID's inside temperature and outside temperature. That is, fan motors 10B and 10D acts as blowers, and fan motors 10A and 10C serves as exhausters.

The air circulation systems in the four cases above are represented in Table 2.

TABLE 2

| Environmental Condition per case | Blower | Air exhauster |
|---|---|---|
| Case 1 | 10C & 10D | 10A & 10B |
| Case 2 | 10A & 10B | 10C & 10D |
| Case 3 | 10A, 10B 10C, 10D | 10A, 10B 10C, 10D |
| Case 4 | 10B & 10D | 10A & 10C |

Referring to Table 2 and FIG. 8, the inventive fan motors are actuated to circulate the hot air down and up (Case 1), and to move damp air up and down (Case 2), using the characteristic of humid air being heavier than dry air. Particularly, when ambient temperature and humidity are both higher than the preset reference values (Case 3), fan motors 10A, 10B and 10C, 10D operate as blowers and air exhausters, respectively, thereby controlling air circulation properly inside the RAID.

The present invention, as described above, controls the fans used as air circulating devices to operate in two directions in accordance with the environmental condition of the RAID's interior, which provides proper ventilation for the RAID, thereby preventing it from overheating or corroding, thus enhancing reliability.

Therefore, it should be understood that the present invention is not limited to the particular embodiment disclosed herein as the best mode contemplated for carrying out the present invention, but rather that the present invention is not limited to the specific embodiments described in this specification except as defined in the appended claims.

What is claimed is:

1. An air circulation system for an RAID system having a fan motor operable in opposite directions for driving a fan for circulating air inside the RAID system, and having a power supply operable in accordance with opposite polarities for running the fan motor, said system comprising:

sensing circuit means for producing an electrical signal proportional to environmental conditions inside the RAID system;

controller means for producing control signals for controlling the direction of the fan motor when said electrical signal from said sensing circuit means exceeds a preset reference value; and switching circuit means for changing the polarity of the power supply in response to said control signals from said controller means.

2. An air circulation system according to claim 1, wherein said sensing circuit means includes a temperature sensor for detecting an ambient temperature of the RAID system and a humidity sensor for detecting an ambient humidity of the RAID system.

3. An air circulation system according to claim 1, wherein said switching circuit means comprises at least one switch connected between said fan motor and said power supply, said at least one switch having a first position for connecting said power supply to said motor in a positive polarity mode, and having a second position for connecting said power supply to said fan motor in a negative polarity mode.

4. An air circulation system according to claim 3, wherein said switching circuit means further comprises a resistor connected between said at least one switch and said fan motor.

5. An air circulation system according to claim 1, wherein said switching circuit means comprises a first switch having a first position for connecting said power supply to a first side of said fan motor and having a second position for connecting said first side of said fan motor to ground, and a second switch having a first position for connecting a second side of said fan motor to ground and a second position for connecting said power supply to said second side of said fan motor.

6. A method of controlling air circulation inside an RAID system having a fan motor operable in opposite directions for driving a fan for circulating air inside the RAID system, a power supply operable in accordance with opposite polarities for running the fan motor, a sensing circuit for producing an electrical signal corresponding to an environmental condition of the interior of the RAID system, and a controller for producing control signals to control the fan motor when said electrical signal exceeds a preset limit, the method comprising the steps of:

comparing an ambient temperature and a humidity inside the RAID system against preset reference values corresponding to environmental specifications of the RAID system; and operating the fan motor alternatively in forward and reverse directions to produce proper air circulation within the RAID system.

7. A method of controlling air circulation according to claim 6, wherein said operating step comprises operating the fan motor when at least one of the ambient temperature and the humidity exceeds a corresponding one of preset reference values, and controlling horizontal circulation when said at least one of the ambient temperature and the humidity does not exceed said corresponding one of the preset reference values.

8. An air circulation system for an RAID system having a fan for circulating air inside the RAID system and a power supply for supplying voltage of opposite polarities, said system comprising:

sensing circuit means for sensing an environmental condition inside the RAID system and producing a corresponding electrical signal;

central processing means responsive to the electrical signal from said sensing circuit means for producing a fan driving control signal;

fan motor means for driving said fan so as to circulate the air inside the RAID system;

switching circuit means connected between said power supply and said fan motor means, and responsive to said fan driving control signal from said central processing means for altering the polarity of the voltage provided by said power supply to said fan motor means in accordance with the fan driving control signal from said central processing means.

9. An air circulation system according to claim 8, wherein said sensing circuit means comprises at least one of a temperature sensor and a humidity sensor.

10. An air circulation system according to claim 8, wherein said sensing circuit means produces an output signal proportional to at least one environmental condition inside the RAID system, and wherein said central processing means produces the fan driving control system when the output signal of said sensing circuit means exceeds a preset limit.

11. An air circulation system according to claim 10, wherein said central processing means allows air inside the RAID system to circulate in a horizontal direction when the output signal of said sensing circuit means does not exceed the preset limit.

12. An air circulation system according to claim 8, wherein said sensing circuit means produces an output signal proportional to at least one environmental condition inside the RAID system, and wherein said central processing means allows air inside the RAID system to circulate in a horizontal direction when the output signal of the sensing circuit means does not exceed a preset limit.

13. An air circulation system according to claim 8, wherein said switching circuit means comprises at least one switch connected between said fan motor and said power supply, said at least one switch having a first position for connecting said power supply to said motor in a positive polarity mode, and having a second position for connecting said power supply to said fan motor in a negative polarity mode.

14. An air circulation system according to claim 13, wherein said switching circuit means further comprises a resistor connected between said at least one switch and said fan motor.

15. An air circulation system according to claim 8, wherein said switching circuit means comprises a first switch having a first position for connecting said power supply to a first side of said fan motor and having a second position for connecting said first side of said fan motor to ground, and a second switch having a first position for connecting a second side of said fan motor to ground and a second position for connecting said power supply to said second side of said fan motor.

16. A method of controlling air circulation inside a RAID system having at least one fan for circulating air inside the RAID system, comprising steps of:

providing a fan motor for driving the fan so as to circulate the air inside the RAID system;

sensing at least one of an ambient temperature and the humidity inside the RAID system;

comparing said at least one of the ambient temperature and the humidity inside the RAID system to a preset reference value corresponding to environmental specifications of the RAID system;

if said at least one of the ambient temperature and the humidity inside the RAID system exceeds the preset reference value, operating the fan driving motor to drive the fan so as to produce proper air circulation within the RAID system; and if said at least one of the ambient temperature and the humidity inside the RAID system does not exceed the preset reference value, allowing the air inside the RAID system to circulate in a horizontal direction.

17. An air circulation system according to claim 16, wherein the step of providing said fan motor comprises providing a fan motor which is operable alternatively in forward and reverse directions; and wherein the step of operating the fan motor comprises operating the fan motor alternatively in the forward and reverse directions so as to drive the fan alternatively in a forward and a reverse direction of rotation, thereby producing proper air circulation within the RAID system and achieving adjustment of the environmental conditions within the RAID system.

18. An air circulation system according to claim 16, wherein at least one upper fan and at least one lower fan are provided within the RAID system, and wherein, when the ambient temperature inside the RAID system exceeds the preset reference value and the humidity inside the RAID system does not exceed the preset reference value, said at least one lower fan is operated as a blower and said at least one upper fan is operated as an exhauster.

19. A method of controlling air circulation according to claim 16, wherein at least one upper fan and at least one lower fan are provided within the RAID system, and wherein, when the humidity inside the RAID system exceeds the preset reference value and the ambient temperature inside the RAID system does not exceed the preset reference value, said at least one upper fan is operated as a blower and said at least one lower fan is operated as an air exhauster.

20. A method of controlling air circulation according to claim 16, wherein at least one upper fan and at least one lower fan are provided within the RAID system and wherein, when both the ambient temperature and the humidity inside the RAID system exceed the preset reference values, said at least one upper fan is operated as a blower and said at least one lower fan is operated as an exhauster in order to move hot air downward so as to vaporize any moisture within the RAID system, and said at least one upper fan is operated as an air exhauster and said at least one lower fan is operated as an air blower once the air containing vapor is driven out of the RAID system.

21. A method of controlling air circulation according to claim 16, wherein at least two upper fans and at least two lower fans are provided within the RAID system, and wherein, when both the ambient temperature and the humidity inside the RAID system do not exceed the preset reference values, one of the upper fans and one of the lower fans are operated as blowers and the other one of the upper fans and the other one of the lower fans are operated as exhausters, thereby achieving horizontal air circulation within the RAID system.

\* \* \* \* \*